(12) United States Patent
Conte et al.

(10) Patent No.: US 6,299,746 B1
(45) Date of Patent: Oct. 9, 2001

(54) GETTER SYSTEM FOR PURIFYING THE CONFINEMENT VOLUME IN PROCESS CHAMBERS

(75) Inventors: Andrea Conte; Francesco Mazza, both of Milan (IT)

(73) Assignee: SAES Getters, S.p.A. (IT)

( * ) Notice: Subject to any disclaimer, the term of this patent is extended or adjusted under 35 U.S.C. 154(b) by 0 days.

(21) Appl. No.: 09/218,941

(22) Filed: Dec. 22, 1998

(51) Int. Cl.[7] .................................................. C23C 14/34
(52) U.S. Cl. .............................. 204/298.07; 204/298.11; 118/715; 156/345
(58) Field of Search ...................... 204/298.07, 298.11; 118/715; 156/345; 417/48, 51

(56) References Cited

U.S. PATENT DOCUMENTS

| | | | |
|---|---|---|---|
| 4,137,012 | * 1/1979 | Della Porta et al. | 417/48 |
| 5,242,559 | 9/1993 | Giorgi | 204/181.4 |
| 5,324,172 | * 6/1994 | Manini et al. | 417/51 |
| 5,669,961 | 9/1997 | Baker et al. | 95/115 |
| 5,778,682 | 7/1998 | Ouellet | 62/55.5 |

FOREIGN PATENT DOCUMENTS

| | | |
|---|---|---|
| 0475412 | 3/1992 | (EP). |
| 0 693 626 A1 | 1/1996 | (EP). |
| 0 693 626A | 1/1996 | (EP). |
| 0 719 609 A2 | 7/1996 | (EP). |
| 0 719 609A | 7/1996 | (EP). |
| 0 765 012 A2 | 3/1997 | (EP). |
| 07033417 | 3/1995 | (JP). |
| WO 95/23425 | 8/1995 | (WO). |
| WO 97/17542 | 5/1997 | (WO). |
| WO 97/17542A | 5/1997 | (WO). |
| WO 98/03987 | 1/1998 | (WO). |

OTHER PUBLICATIONS

Schiller et al., "Advances in High Rate Sputtering with Magnetron–Plasmatron Processing and Instrumentation", Thin Solid Films, 64 (1979) 455–467, Apr. 1979.*

Sciuccati et al. "In situ pumping with NEG (non–evaporable getters) during vacuum processing", Vacuum, vol. 38, Nos. 8–10, pp. 765–769, 1988.*

Saes getters, Gettering Products for the Electronic Industry throughout the World, "Sorb–AC Getter Wafers MOdules and Panels".*

Heyder, R., et al, "Nonevaporable Gettering Technology for In–Sity Vacuum Processes", *Solid State Technology*, U.S. Cowan Publ. Corp., Washington. vol. 39, No. 8, pp. 71–72, 74 (1996).

* cited by examiner

*Primary Examiner*—Rodney G. McDonald
(74) *Attorney, Agent, or Firm*—Oppenheimer Wolff & Donnelly, LLP

(57) ABSTRACT

A getter system for purifying the gaseous atmosphere within a confinement volume of a process chamber is disclosed. In a process chamber provided with at least one screen that defines a confinement volume, the getter system includes at least one substantially planar getter device disposed within the confinement volume such that the at least one getter device is substantially parallel to and spaced apart from the at least one screen. The at least one getter device has an inner surface facing the at least one screen and an outer surface facing the confinement volume, with at least the inner surface being formed of getter material. The at least one getter device is spaced apart from the at least one screen such that the inner surface and the at least one screen define an inner space that is in gas flow communication with the confinement volume.

21 Claims, 6 Drawing Sheets

GETTER SYSTEM FOR PURIFYING THE CONFINEMENT VOLUME IN PROCESS CHAMBERS

This patent application claims priority under 35 U.S.C. §119 from Italian Patent Application No. M197 A 02862, filed Dec. 23, 1997, which is incorporated herein by reference for all purposes.

BACKGROUND OF THE INVENTION

The present invention relates generally to process chambers and, more particularly, to a getter system for purifying the confinement volume in process chambers.

Thin layers of metallic or ceramic materials deposited by, e.g., physical vapor deposition (PVD), which is also referred to as "sputtering," are used in a variety of applications. For example, in the semiconductor industry, a number of layers are deposited by PVD and then selectively removed in the fabrication of integrated circuits. In the compact disc and digital versatile disc (DVD) industries, the reflective layer of aluminum is deposited by PVD.

The processes used to deposit such thin layers require the use of high purity gases. In particular, in the fabrication of semiconductors, impurities in the process gases may result in microflaws in the electronic devices. In general, the smaller the size of the device, the greater the effect such microflaws have on the operability of the device. In light of the continuing trend to reduce the average size of electronic devices, the use of increasingly pure process gases is required to obtain an acceptable yield percentage.

A common practice in the semiconductor industry for purifying gases upstream of a process chamber, e.g., a PVD process chamber, is the use of getter materials in combination with conventional pumps. Even when the purity of the inlet gases is controlled, however, impurities may be introduced in the chamber as the result of the degassing of the materials forming the walls or other parts of the chamber. For example, contamination is a significant problem in the deposition of aluminum and titanium nitride layers. In the sputtering process typically used to deposit such layers, the flat surface of a target, which consists of the material to be deposited, is eroded by the impact of ions of heavy atoms, e.g., Ar+ ions, that have be accelerated by a suitable electric field. The particles removed from the surface of the target are deposited in the form of thin layers onto the substrate of semiconductor material, which faces the target and is generally arranged so as to be parallel to the surface of the target. During the sputtering process, the gases within the target, e.g., gases mechanically incorporated into the structure of the material during production, are discharged and result in a high concentration of impurities in the confinement volume. The most common impurities are $H_2O$, $H_2$, $CO$, $CO_2$, and $CH_4$, and the concentration of these impurities may range, depending upon the specific features of each deposition process, from about 1 ppm to about 100 ppm.

International Publication Nos. WO 96/13620, WO 96/17171, and WO 97/17542, European Publication No. 0 693 626, and U.S. Pat. No. 5,778,682 to Ouellet disclose in situ getter pump systems for purifying gases arranged inside process chambers, e.g., PVD chambers. These in situ getter pump systems are disposed within the process chambers at locations outside of the confinement volume. One of the main advantages of such an in situ getter pump system is that it substantially reduces the pump down time required for the chamber to reach acceptable vacuum and impurity levels after the chamber has been opened, e.g., for maintenance operations.

The in situ getter pump systems disclosed in the above-listed references do not fully solve the problem of impurities within the confinement volume during PVD operations because this volume is defined by screens that prevent the target material from being deposited onto undesired portions of the chamber, e.g., feedthroughs, openings for connecting the chamber to gas lines, etc. These screens significantly reduce the gas conductance between the confinement volume and the remaining volume of the chamber and thereby create two different gaseous atmospheres within the processing chamber. As a result of this reduced gas conductance, the sorption of impurities in the confinement volume by the in situ getter pump systems disclosed in the above-listed references is negligible. Thus, the problem of effectively purifying the gaseous atmosphere within the confinement volume during PVD operations so that contamination of the deposited layers is avoided remains unsolved.

In view of the foregoing, there is a need for a mechanism that effectively purifies the gaseous atmosphere within the confinement volume of a process chamber, e.g., a PVD chamber, such that contamination of the deposited layers is avoided.

SUMMARY OF THE INVENTION

Broadly speaking, the invention fills this need by providing a getter system for purifying the gaseous atmosphere within the confinement volume of a process chamber, e.g., a PVD chamber. The getter system includes one or more substantially planar getter devices that are arranged so as to be substantially parallel to and spaced apart from the screens that define the confinement volume.

In one aspect of the invention, a getter system for use in a process chamber having at least one screen that defines a confinement volume is provided. The getter system includes at least one substantially planar getter device disposed within the confinement volume such that the at least one getter device is substantially parallel to and spaced apart from the at least one screen. The at least one getter device has an inner surface facing the at least one screen and an outer surface facing the confinement volume, with at least the inner surface being comprised of getter material. The at least one getter device is spaced apart from the at least one screen such that the inner surface and the at least one screen define an inner space that is in gas flow communication with the confinement volume.

The outer surface of the at least one getter device preferably occupies about 70% to about 99%, and more preferably about 80% to about 95%, of the available surface area. This may be accomplished by using multiple getter devices that are arranged so that they are not in contact with one another or by using one or more getter devices that are discontinuous. The distance between the inner surface of the at least one getter device and the at least one screen is preferably in a range from about 1 mm to about 5 cm.

The at least one getter device may be formed of a variety of getter materials. Suitable getter materials include but, are not limited to Zr, Ti, Nb, Ta, V, alloys thereof, and alloys containing one or more of Zr, Ti, Nb, Ta, and V and one or more of Cr, Mn, Fe, Co, Ni, Al, Y, La, and rare earths. Preferred getter materials include an alloy containing 84 wt % of Zr and 16 wt % of Al, an alloy containing 70 wt % of Zr, 24.6 wt % of V, and 5.4 wt % of Fe, an alloy containing 84 wt % of Zr and 16 wt % of Al and at least one of Zr and Ti, and an alloy containing 70 wt % of Zr, 24.6 wt % of V, and 5.4 wt % of Fe and at least one of Zr and Ti.

In one embodiment the at least one getter device is a body obtained by sintering powdered getter material. In another embodiment the at least one getter device is comprised of getter material deposited onto a metal support. The metal support is preferably comprised of a nonferromagnetic material such as, for example, steel or a nickel-chromium alloy. The metal support preferably has a thickness in a range from about 0.1 mm to about 1 mm. The deposit of getter material preferably has a thickness in a range from about 20 $\mu$m to about 500 $\mu$m.

In another aspect of the invention, a process chamber for physical vapor deposition is provided. The process chamber includes a housing and a substrate support disposed within the housing. A target is disposed within the housing such that the target faces the substrate support. At least one screen is disposed within the housing and defines a confinement volume that extends between the target and the substrate support. A getter system is disposed within the confinement volume.

In one embodiment the getter system includes at least one substantially planar getter device disposed within the confinement volume such that the at least one getter device is substantially parallel to and spaced apart from the at least one screen. The at least one getter device has an inner surface facing the at least one screen and an outer surface facing the confinement volume, with at least the inner surface being comprised of getter material. The at least one getter device is spaced apart from the at least one screen such that the inner surface and the at least one screen define an inner space that is in gas flow communication with the confinement volume.

The getter system of the present invention effectively purifies the gaseous atmosphere within the confinement volume of a process chamber. This significantly reduces contamination of the thin layers being deposited and thereby increases the efficiency with which such layers may be produced. The getter system of the present invention is particularly advantageous in the deposition of titanium, which is a well known getter material. During the deposition process, some of the titanium is deposited on the screens that define the confinement volume. The extent to which the titanium deposited on the screens sorbs hydrogen is significantly reduced because the getter system of the invention effectively sorbs hydrogen and other impurities from the confinement volume of the process chamber. As a result, the titanium deposited on the screens does not flake off in the form of metal microlayers and contaminate the thin film of titanium being deposited on the substrate. Thus, the getter system of the invention increases the efficiency with which thin layers of titanium may be deposited.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

Reference will now be made to the present preferred embodiments of the invention, examples of which are illustrated in the accompanying drawings.

Figure 1:
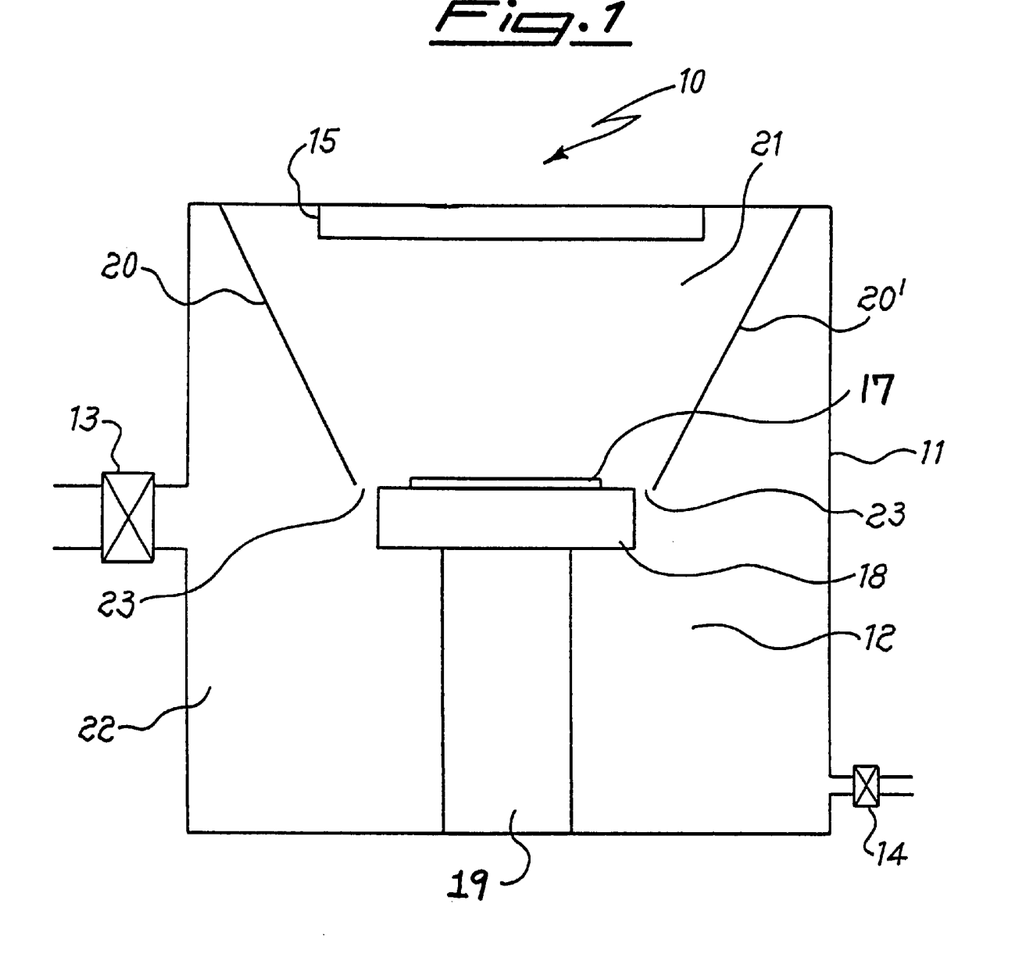
FIG. 1 is a simplified, diagrammatic illustration of a representative PVD process chamber for the production of integrated circuit devices.

FIG. 1 shows a simplified, diagrammatic illustration of a representative PVD process chamber for the production of integrated circuit devices. As shown therein, chamber 10 includes housing 11 that defines a space 12 that is isolated from the atmosphere. Chamber 10 is connected to a pump system 13 for evacuating space 12 and at least one gas feed line 14 for supplying process gases. Those skilled in the art will recognize that the location of the inlets for pump system 13 and feed line 14 may be varied to suit specific processing requirements. Target 15, which is generally shaped in the form of a disk or a short cylinder, is disposed within housing 11 at the top thereof. As is well known to those skilled in the art, the material from which target 15 is made is deposited in the form of a thin layer on substrate 17 during processing. In the production of integrated circuit devices, substrate 17 is typically comprised of a semiconductor material, e.g., silicon. Substrate support 18, which is mounted on pedestal 19, supports substrate 17. Screens 20, 20' divide space 12 into two volumes: confinement volume 21 in which deposition occurs and auxiliary volume 22 in which the auxiliary PVD processing structures, e.g., electrical connections and inlets for gas feed lines, are situated. Confinement volume 21 and auxiliary volume 22 communicate with one another through opening 23 at the edge of the screens 20, 20'.

Those skilled in the art will appreciate that a variety of modifications may be made to the simplified representation of a PVD process chamber shown in FIG. 1. For example, screens 20, 20', which are essentially planar, may be disposed within housing 11 in the polygonal arrangement that defines the desired geometry of confinement volume 21. By way of example, the shape of confinement volume 21 may be either square or cylindrical. Target 15 may be made of the material to be deposited on substrate 17 as stated above or, alternatively, may be part of a system including multiple targets. This latter configuration may be used to enable the sequential deposition of thin layers of different materials without opening chamber 10. Substrate support 18 may be heated to maintain the temperature of substrate 17 at the optimal temperature for obtaining a thin layer with homogeneous properties. The optimal temperature is generally within a range from about 100° C. to about 500° C. depending on the material being deposited. Pedestal 19 may be shifted in the vertical direction to bring substrate 17 into the desired position for deposition.

As described above in the "Background of the Invention" section, known in situ getter pump systems disposed within a process chamber have been located within auxiliary volume 22 as shown in FIG. 1. Thus, these in situ getter pump systems are essentially isolated from confinement volume 21 because opening 23 provides a small gas conductance between confinement volume 21 and auxiliary volume 22. As a result being isolated therefrom, these in situ getter pump systems do not effectively purify the atmosphere within the confinement volume. In contrast, as will be explained in detail below, the getter system of the present invention effectively sorbs impurities from the atmosphere within the confinement volume because the getter system is disposed within this volume.

Figure 2:
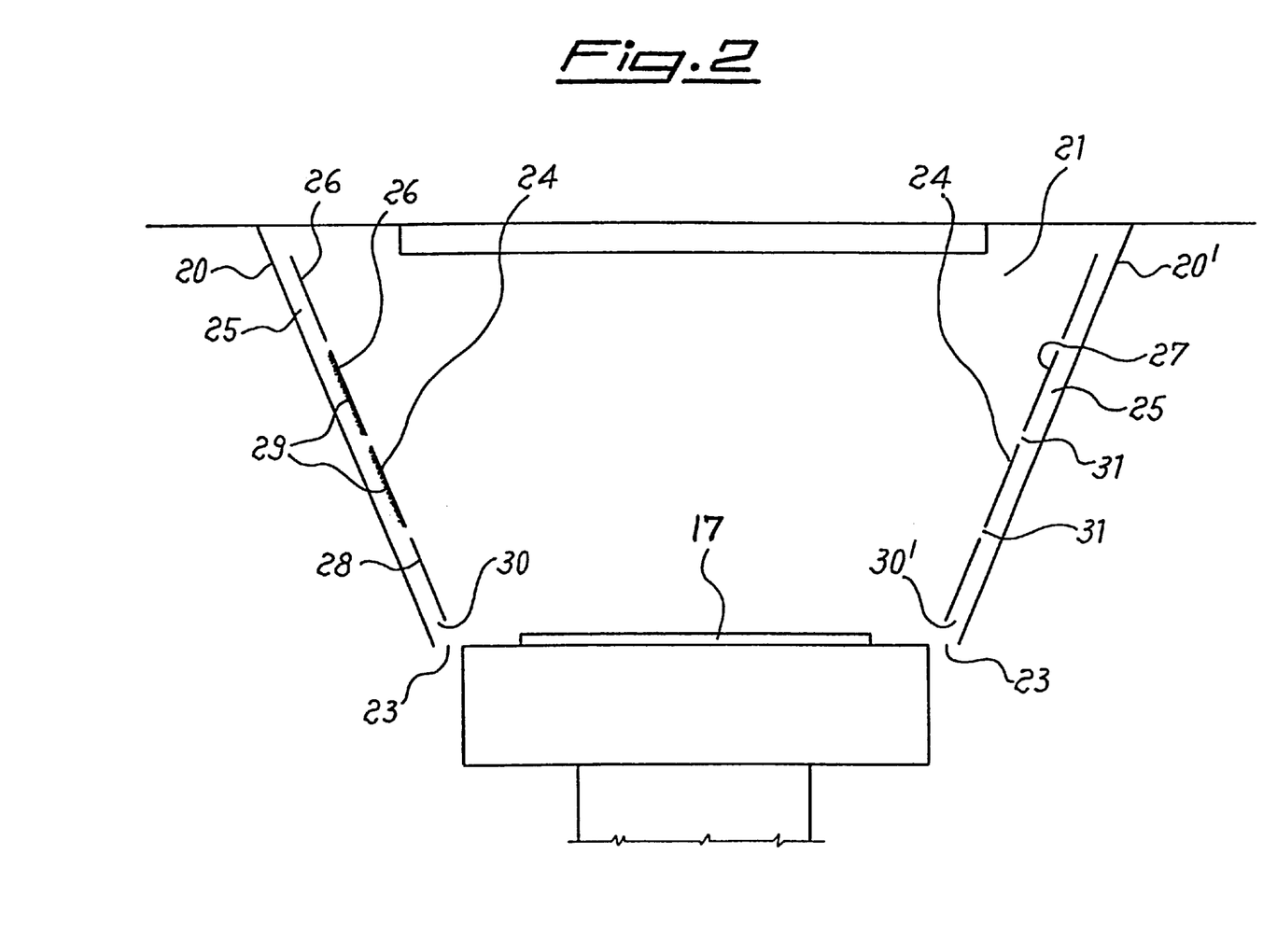
FIG. 2 illustrates a getter system disposed within the process chamber of FIG. 1 in accordance with one embodiment of the invention.

FIG. 2 illustrates a getter system disposed within a process chamber, e.g., the process chamber shown in FIG. 1, in accordance with one embodiment of the invention. As shown therein, getter system 24 includes a number of getter devices 26, which are substantially planar. Each getter device 26 is fastened to one of screens 20, 20' so as to be substantially parallel thereto. Suitable methods for fastening getter devices 26 to one of screens 20, 20' will be described in detail later. The getter devices 26 forming getter system 24 and screens 20, 20' define an inner space 25 therebetween. The collective surfaces of getter devices 26 that face confinement volume 21 define outer surface 27 of getter system 24. The collective surfaces of getter devices 26 that face screens 20, 20' define inner surface 28 of getter system 24. At least inner surface 28 of getter system 24 must be comprised of getter material. If desired, outer surface 27 of getter system 24 also may be comprised of getter material or the entirety of getter system 24 may be comprised of getter material.

Getter system 24 preferably wholly encloses confinement volume 21, to maximize the available surface area of getter material and thereby increase the efficiency with which impurities are sorbed. If desired, however, getter system 24 may be arranged within the confinement volume 21 so as to sweep an angle smaller than 360°, in which case the getter system may be comprised of a single getter device. In the preferred case where the getter system sweeps a 360° angle and fully encloses the confinement volume, however, the getter system generally includes a number of getter devices. The number of getter devices is preferably equal to or greater than the number of screens.

One requirement of the getter system of the invention is that inner space 25 must be in gas flow communication with confinement volume 21. This requirement may be satisfied in a number of ways. For example, the outer surface 27 of getter system 24 may be continuous and arranged such that gas conductance between confinement volume 21 and inner space 25 occurs at areas 30, 30' (see FIG. 2). More preferably, however, getter devices 26 are either shaped or arranged such that outer surface 27 is discontinuous. In particular, it has been found that the best efficiency in removing impurities from confinement volume 21 is obtained when outer surface 27 occupies about 70% to about 99%, and preferably from about 80% to about 95%, of the available surface area, i.e., the surface area available for a continuous getter system 24. With reference to FIG. 2, discontinuities 31 in outer surface 27 may be in the form of holes in getter devices 26 or spaces between adjacent devices 26. In either case, discontinuities 31 may have either a regular or irregular shape and may be either regularly or irregularly arranged on the available surface. In the case of holes formed in a single getter device 26, the holes may have a square, round, or irregular shape and may be arranged on the surface of device 26 either in a regular pattern or randomly. In the case of spaces formed between adjacent getter devices 26, the shape and the arrangement of the spaces depends on the arrangement of devices 26 on the available surface. In general, regular shapes and arrangements of the discontinuities are preferred, both in a single getter device and between adjacent getter devices, because such characteristics are more suitable for automated production processes and are easier to control to obtain the desired ratio between the occupied surface area and the available surface area. Those skilled in the art will appreciate that mixed configurations in which individual getter devices have holes and adjacent getter devices are spaced apart from one another also may be used.

The preferred distance between getter system 24 and screens 20, 20' is a function of the overall size of confinement volume 21 and, depending upon the configuration of system 24, one or both of the distances between adjacent getter devices 26 and the size of the holes in devices 26. In general, the preferred distance between the getter system and the screens is in the range from about 1 mm to 5 cm. Within this preferred range, the distance is generally shorter in smaller PVD chambers to prevent the getter system from affecting the processes occurring within the confinement volume. The distance increases as the distance between adjacent getter devices or the size of the holes in the getter devices increases.

A wide variety of getter materials may be used to produce getter devices 26. By way of example, suitable getter materials include metals such as Ti, Zr, Nb, Ta, V, alloys of these metals or alloys of these metals and one or more elements selected from among Cr, Mn, Fe, Ni, Al, Y, La, and rare earths, e.g., binary alloys such as Ti—V, Zr—V, Zr—Fe, and Zr—Ni or ternary alloys such as Zr—Mn—Fe and Zr—V—Fe, or a mixture of the aforementioned metals and alloys. Commercially available getter materials produced by SAES Getters S.p.A. of Lainate, Italy, the assignee of the present application, that are well suited for use in the getter system of the invention include the alloys sold under the trade names St 101® and St 707™. The St 101® alloy has a composition of 84 wt % Zr and 16 wt % Al. The St 707™ alloy has a composition of 70 wt % Zr, 24.6 wt % V, and 5.4 wt % Fe. Suitable getter materials also include mechanical mixtures of the St 101® and St 707™ alloys and Zr or Ti. Such mixtures are preferred because of their desirable mechanical properties, particularly resistance to particle loss.

Getter devices 26 may be bodies formed solely of getter material by, e.g., powder sintering, or may be formed of getter material deposited onto a metal support. The production of sintered bodies from powders is well known to those skilled in powder metallurgy. In general, the production steps include compressing getter material powder in a suitable mold to form a powder compact and then sintering the powder compact to bond the powder particles. If desired, these general steps may be modified to obtain bodies having specific properties, e.g., high porosity, as disclosed in U.S. Pat. No. 5,324,172, European Patent Application No. EP 0 719 609, and European Patent Application No. EP 0 765 012, the disclosures of which are incorporated herein by reference.

Figure 3:
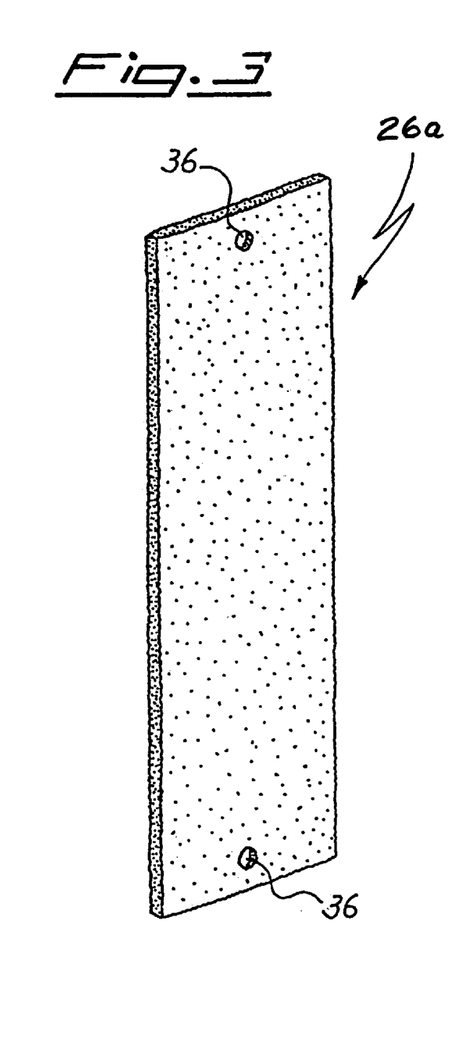
FIG. 3 shows one embodiment of a getter device formed of a sintered body of getter material.
Figure 4:
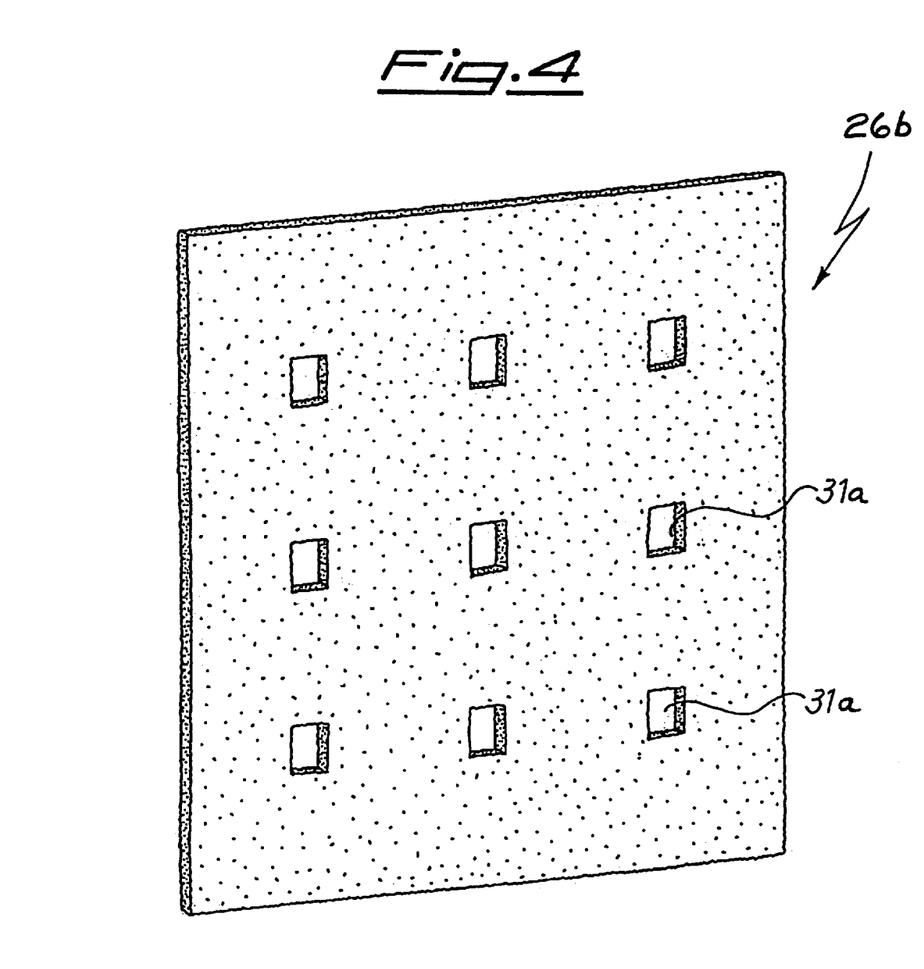
FIG. 4 shows another embodiment of a getter device formed of a sintered body of getter material.

FIGS. 3 and 4 show getter devices formed of sintered bodies of getter material. FIG. 3 shows a rectangular-shaped getter device 26a having holes 36 provided at the ends thereof. Holes 36 are configured to receive suitable fasteners, e.g., screws or bolts, for fastening getter device 26a to the screens at the desired distance therefrom. Those skilled in the art will appreciate that other fastening techniques also may be used. For example, the getter devices may be fastened to the screens using the combination of a metal member having a frame for supporting the getter device integrated therein and suitable spacers fastened to the screens. FIG. 4 shows a square-shaped getter device 26b having a series of holes 31a formed therein. As described above, holes 31a allow gas flow between confinement volume 21 and inner space 25 (see FIG. 2). During the PVD process, the surface of the getter device, e.g., getter device 26a or 26b, facing confinement volume 21 becomes covered with the material being deposited in the form of a thin layer on substrate 17, whereas the surface of the getter device facing the screen or screens actively sorbs impurities.

Figure 5:
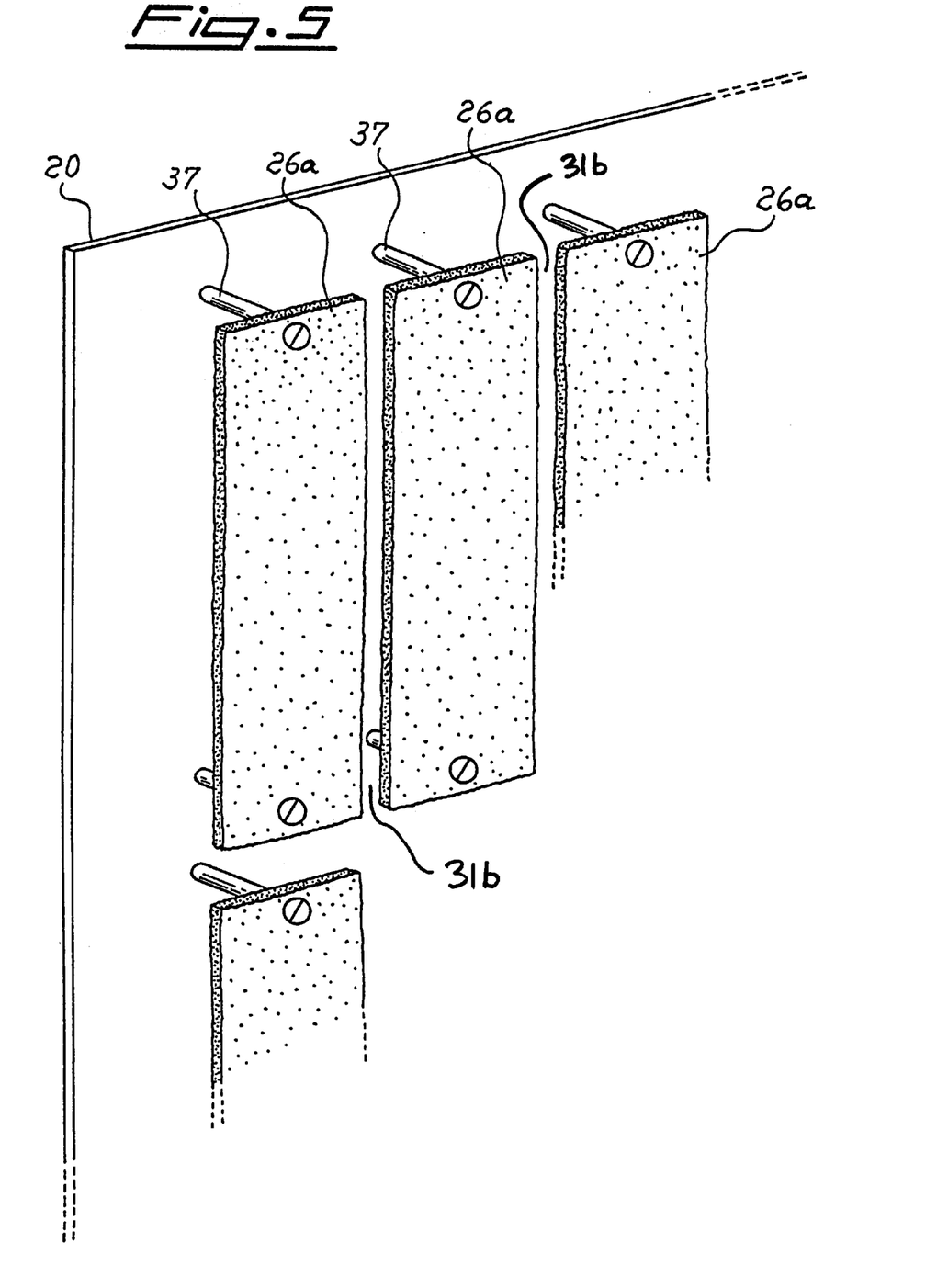
FIG. 5 shows a partial cutaway view of a getter system including a plurality of the getter devices shown in FIG. 3 in accordance with one embodiment of the invention.

The manufacture of planar sintered bodies having lengths and widths that greatly exceed their thickness is complex. Moreover, such planar sintered bodies generally have low mechanical strength. Accordingly, when sintered bodies are used in the getter system of the invention, the getter system preferably includes a plurality of getter devices, each of which has a surface area considerably smaller than screen or screens to which the device is fastened. FIG. 5 shows an example of a getter system including a plurality of getter devices. As shown therein, getter devices 26a are fastened to screen 20 with fasteners 37. The individual getter devices 26a are spaced apart such that discontinuities 31b are defined between adjacent devices 26a.

As described above, getter devices 26 also may be made by depositing getter material onto a metal support. Those skilled in the art are familiar with suitable techniques for forming getter devices of this type including, by way of example, cold lamination, a spray technique, electrophoresis, or screen printing. Cold lamination is well known to those skilled in the art of powder metallurgy. The spray technique involves spraying a suspension of getter particles in a suitable solvent onto a hot metal support. Further details of this technique are set forth in International Publication No. WO 95/23425, the disclosure of which is incorporated herein by reference. The details of the electrophoretic technique are disclosed in U.S. Pat. No. 5,242,559, the disclosure of which is incorporated herein by reference. A suitable screen printing technique is set forth in International Publication No. WO 98/03987, the disclosure of which is incorporated herein by reference.

The support may be made of any suitable material, but is preferably made of a metal capable of withstanding temperatures of about 600° C., which may be necessary to activate the getter material. Furthermore, to avoid interference with the magnetic fields sometimes used in PVD processes, the metal is preferably not ferromagnetic. Preferred metals include steel and nickel-chromium alloys. The thickness of the support may be varied within a wide range, but is preferably in the range from about 0.1 mm to about 1 mm. To provide adequate mechanical stability, the thickness of the support is preferably increased as the side dimensions, i.e., length and width, of the getter device are increased. The thickness of the getter material deposit formed on the metal support is preferably in the range from about 20 $\mu$m to about 500 $\mu$m for reasons related to production expediency and the mechanical stability of the deposit. Those skilled in the art that will appreciate that the thickness of the deposit may be varied to suit the needs of the particular PVD process. The getter devices are mounted onto the screens so that the surface having the getter material deposited thereon faces the screens. Furthermore, in contrast with a getter system including getter devices formed of sintered bodies of getter material, a getter system including getter devices obtained by depositing getter material onto a metal support is preferably formed of a relatively small number of getter devices.

In particular, it is preferred that just one, or at most two, getter devices are fastened to each screen. The use of such getter devices having a relatively large surface area is desirable because they are not only easy to produce but also easy to install. Thus, the use of such getter devices reduces both manufacturing and installation costs.

Figure 6:
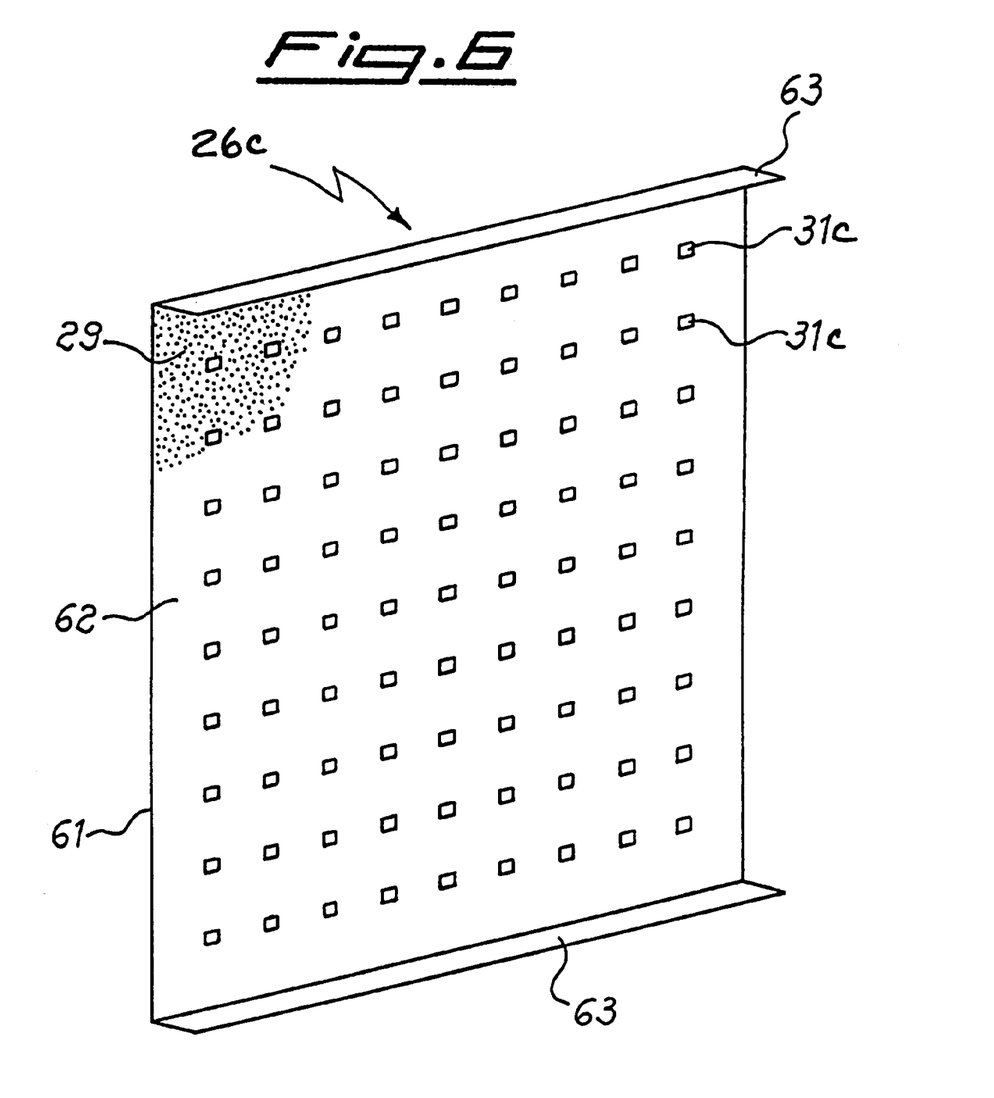
FIG. 6 shows one embodiment of a getter device obtained by depositing getter material onto a metal support.

FIG. 6 shows one embodiment of a getter device obtained by depositing getter material on a metal support. As shown therein, getter device 26c includes an essentially planar metal support 61 having getter material 29 deposited on surface 62 thereof. A plurality of holes 31c are formed in support 61. Opposing ends of support 61 are provided with folded edges 63, which act as spacers between getter device 26c and the screen to which it is fastened. Those skilled in the art will recognize that structures other than folded edges also may be used as spacers. As set forth above in connection with the description of FIG. 2, holes 31c may have a square, round, or irregular shape and may be arranged on the surface of device 26c either in a regular pattern or randomly. The use of holes that have a square or round shape and are arranged in a regular pattern are preferred because they are conducive to automated production.

Figure 7:
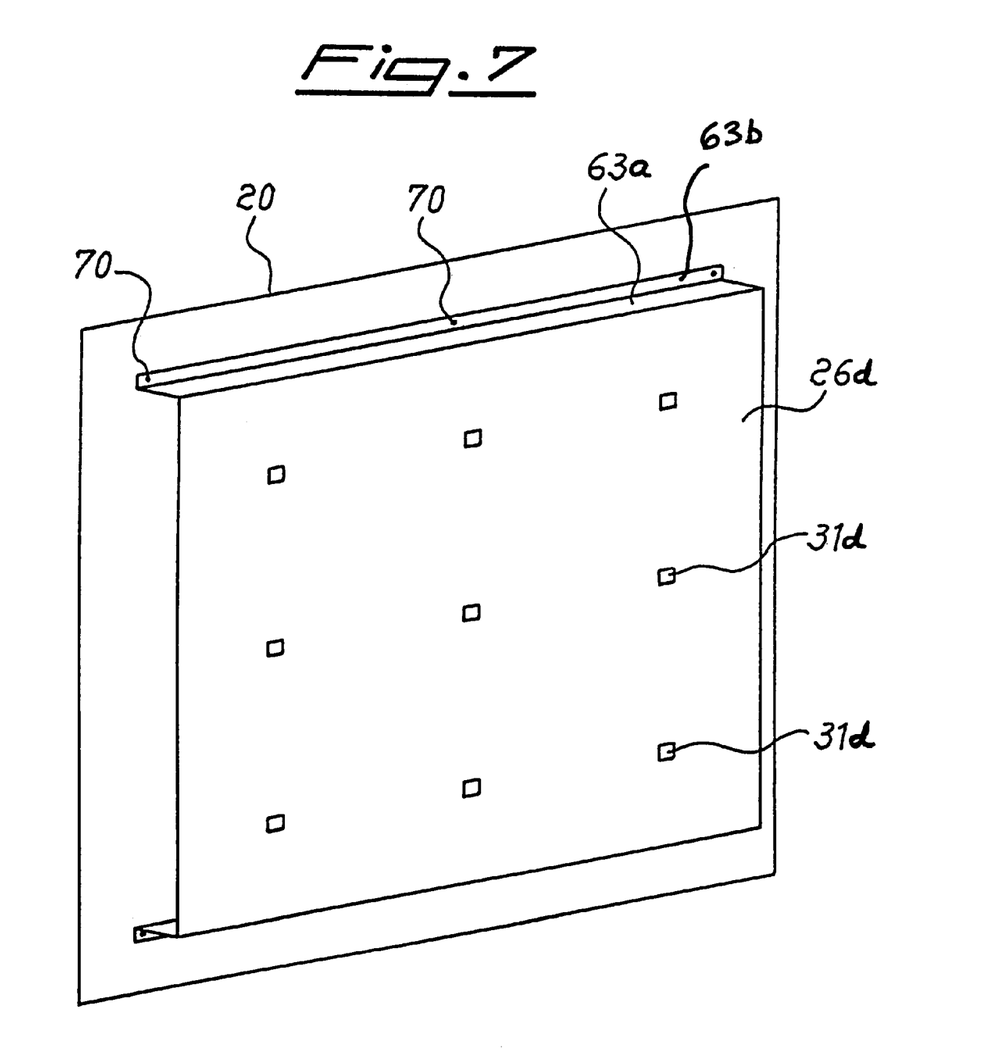
FIG. 7 illustrates one exemplary method by which a getter device of the type shown in FIG. 6 may be fastened to a screen in a PVD chamber to form part of a getter system in accordance with an alternative embodiment of the present invention.

FIG. 7 illustrates one exemplary method by which a getter device forming part of a getter system in accordance with the present invention may be fastened to a screen in a PVD chamber. As shown therein, getter device 26d is fastened to screen 20 by weld spots on double-folded edge 63b, which is formed by folding the end of folded edge 63a. Those skilled in the art will recognize that suitable mechanical mounting members, e.g., screws or bolts, also may be used to fasten the getter devices to the screens.

As is known to those skilled in the art, getter materials require activation before they sorb impurities. The activation operation typically involves heating the getter material to temperatures of at least 300° C. In the implementation of the getter system of the invention, the activation operation may be incorporated into the preparatory steps required for operation of the PVD chamber, e.g., the heating of the chamber to degas the walls thereof to obtain a better vacuum. Alternatively, the activation of the getter material may be accomplished during the deposition of material onto disposable substrates, which is carried out before each deposition for the purpose of cleaning the target. The temperatures reached in the chamber during both of these operations are generally sufficient to activate the getter material.

The getter system of the invention is particularly well suited for processes in which the material being deposited is titanium, which is well known as a getter material. During the deposition of titanium in a PVD chamber, some of the titanium is deposited on the screens that define the confinement volume. In the absence of a getter system formed in accordance with the invention, this titanium sorbs the hydrogen within the confinement volume and, as a result of this sorption, first swells and then flakes off of the surface of the screen in the form of metal microlayers. These metal microlayers may reach the substrate being processed and contaminate the thin layer being deposited, which adversely affects the quality of the deposition and thereby increases the scrap percentage. In contrast, during deposition in the presence of the getter system of the invention, the getter material sorbs substantially all of the hydrogen in the confinement volume and thereby prevents the flaking of titanium microlayers and the contamination that may be caused thereby. Thus, the getter system of the invention increases the efficiency with which thin layers of titanium may be deposited.

In summary, the present invention provides a getter system for purifying the gaseous atmosphere within the confinement volume of a process chamber. The invention has been described herein in terms of several preferred embodiments. Other embodiments of the invention will be apparent to those skilled in the art from consideration of the specification and practice of the invention. For example, as mentioned above, the getter system of the invention may be configured to operate within a confinement volume that has a square, rectangular, or cylindrical shape. The embodiments and preferred features described above should be considered exemplary, with the invention being defined by the appended claims.

What is claimed is:

1. A process chamber for physical vapor deposition, comprising:

a housing;

a substrate support disposed within said housing a target disposed within said housing, said target facing said substrate support, at least one screen disposed within said housing, said at least one screen defining a confinement volume that extends between said target and said substrate support; and a getter system disposed within said confinement volume, wherein the getter system comprises at least one substantially planar getter device disposed within the confinement volume such that said at least one getter device is substantially parallel to and spaced apart from the at least one screen, said at least one getter device having an inner surface facing the at least one screen and an outer surface facing the confinement volume, at least said inner surface being comprises of getter material, and said at least one getter device being spaced apart from the at least one screen such that said inner surface and the at least one screen define an inner space that is in gas flow communication with said confinement volume.

2. The process chamber of claim 1, wherein the getter system comprises at least one substantially planar getter device disposed within the confinement volume such that said at least one getter device is substantially parallel to and spaced apart from the at least one screen, said at least one getter device having an inner surface facing the at least one screen and an outer surface facing the confinement volume, at least said inner surface being comprised of getter material, and said at least one getter device being spaced apart from the at least one screen such that said inner surface and the at least one screen define an inner space that is in gas flow communication with said confinement volume.

3. The process chamber of claim 1, wherein the outer surface of the at least one getter device occupies about 70% to about 99% of the available surface area.

4. The process chamber of claim 1, wherein multiple getter devices are arranged so that they are not in contact with one another.

5. The process chamber of claim 1, wherein the at least one getter device is discontinuous.

6. The process chamber of claim 1, wherein the outer surface of the at least one getter device occupies about 80% to about 95% of the available surface area.

7. The process chamber of claim 1, wherein the distance between the inner surface of the at least one getter device and the at least one screen is in a range from about 1 mm to about 5 cm.

8. The process chamber of claim 1, wherein the getter material is comprised of a material selected from the group consisting of Zr, Ti, Nb, Ta, V, and alloys thereof.

9. The process chamber of claim 1, wherein the getter material is comprised of a material selected from the group consisting of alloys containing one or more of Zr, Ti, Nb, Ta, and V and one or more of Cr, Mn, Fe, Co, Ni, Al, Y, La, and rare earths.

10. The process chamber of claim 1, wherein the getter material comprises an alloy containing 84 wt % of Zr and 16 wt % of Al.

11. The process chamber of claim 1, wherein the getter material comprises an alloy containing 70 wt % of Zr, 24.6 wt % of V, and 5.4 wt % of Fe.

12. The process chamber of claim 1, wherein the getter material comprises a mixture containing at least one of Zr and Ti, and an alloy containing 84 wt % of Zr and 16 wt % of Al.

13. The process chamber of claim 1, wherein the getter material comprises a mixture containing at least one of Zr and Ti, and an alloy containing 70 wt % of Zr, 24.6 wt % of V, and 5.4 wt % of Fe.

14. The process chamber of claim 1, wherein the at least one getter device is formed substantially entirely from getter material.

15. The process chamber of claim 14, wherein the at least one getter device is a body obtained by sintering powdered getter material.

16. The process chamber of claim 1, wherein the at least one getter device is comprised of getter material deposited onto a metal support.

17. The process chamber of claim 16, wherein the metal support is capable of withstanding thermal treatments up to about 600° C.

18. The process chamber of claim 16, wherein the metal support is comprised of a nonferromagnetic material.

19. The process chamber of claim 16, wherein the metal support is comprised of a material selected from the group consisting of steel and nickel-chromium alloys.

20. The process chamber of claim 16, wherein the metal support has a thickness in a range from about 0.1 mm to about 1 mm.

21. The process chamber of claim 16, wherein the deposit of getter material has a thickness in a range from about 20 $\mu$m to about 500 $\mu$m.

* * * * *